United States Patent
Partsch et al.

(10) Patent No.: US 7,224,623 B2
(45) Date of Patent: May 29, 2007

(54) MEMORY DEVICE HAVING OFF-CHIP DRIVER ENABLE CIRCUIT AND METHOD FOR REDUCING DELAYS DURING READ OPERATIONS

(75) Inventors: Torsten Partsch, Raleigh, NC (US); Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 106 days.

(21) Appl. No.: 11/073,523

(22) Filed: Mar. 8, 2005

(65) Prior Publication Data
US 2006/0203564 A1    Sep. 14, 2006

(51) Int. Cl.
*G11C 7/00*    (2006.01)
(52) U.S. Cl. .................. 365/189.05; 365/191; 365/194
(58) Field of Classification Search .......... 365/189.05, 365/191, 194
See application file for complete search history.

(56) References Cited

U.S. PATENT DOCUMENTS 6,243,797 B1 *    6/2001    Merritt ........................ 711/167
6,842,815 B2 *    1/2005    Yim et al. ................... 710/305

* cited by examiner

*Primary Examiner*—Hoai V. Ho
(74) *Attorney, Agent, or Firm*—Edell, Shapiro & Finnan, LLC

(57) ABSTRACT

A memory device capable of performing a read operation includes: a memory array that stores data; and off-chip drivers that supply as an output of the memory device data retrieved from the memory array. At least one of the off-chip drivers includes: an enable circuit that generates an enable signal in response to a read enable signal received by the off-chip driver, wherein the enable circuit controls the timing of the enable signal in accordance with a timing signal supplied to the enable circuit; and a driver circuit that drives the data off the memory device in response to the enable signal.

32 Claims, 5 Drawing Sheets

MEMORY DEVICE HAVING OFF-CHIP DRIVER ENABLE CIRCUIT AND METHOD FOR REDUCING DELAYS DURING READ OPERATIONS

BACKGROUND OF THE INVENTION

1. Field of the Invention

The present invention relates to a memory device having off-chip drivers that include an enable circuit and related methods for reducing delays during read operations of the memory device.

2. Description of the Related Art

Attempts to minimize size and power consumption of electronic memory devices, such as dynamic random access memories (DRAMs), often lead to omitting certain components and features that may otherwise enhance memory device operation. Such considerations may be particularly important in applications where the memory device is incorporated into a battery-powered or mobile device. For example, some specialty memory devices, such as those used in mobile applications, may not feature any on-chip delay locked loops (DLLs), which are useful for aligning clocks and maintaining timing precision but tend to consume considerable power. Such a memory device can be, for example, a double data rate synchronous dynamic random access memory (DDR SDRAM), which is capable of reading out stored data in read bursts. With each read command, a read burst operation sequentially transmits a given number of data words from the memory device to the system in which the memory device is operating. A DDR SDRAM chip facilitates data transfers on both edges of each successive clock cycle (i.e., both the rising and falling edges), thereby doubling the memory chip data throughput. The data, conventionally denoted as "DQ," is driven off the chip via off-chip drivers (OCD).

Normally, an on-chip DLL aligns the read output to the external system clock (VCLK). Where the on-chip DLL is omitted for size or power considerations, any propagation delay of the internal clocking tree and logic after the last clocked stage before the output pad of the memory device data adds to the output delay ($t_{AC}$) measured from the rising edge of VCLK. More specifically, the internal clock tree essentially derives various clock signals from the external VCLK signal, which are used to time a variety of operations on the memory device. However, the process of generating these internal clock signals and propagation delays across the chip result in timing offsets between the external VCLK signal and the various internal clock signals. Further, any logic circuitry that exists between the point of application of the internal clock signal and the output terminal contributes to the output delay $t_{AC}$ between the VCLK signal and the arrival of data at the output.

While some degree of output delay time $t_{AC}$ is acceptable, it is desirable to minimize the variability of $t_{AC}$, such that the timing of data driven off memory chips is predictable and consistent from OCD to OCD, from chip to chip, and for each individual OCD over the operating time period of the system containing the memory devices, such that the variation of $t_{AC}$ remains within acceptable operational tolerances. Reducing the number of different delays that contribute to $t_{AC}$ tends to reduce the overall variability of $t_{AC}$.

Moreover, the overall delay in retrieving stored data in response to a read command must be taken into consideration when designing memory devices. This timing "budget" may include a number of factors, including $t_{AC}$. Thus, in general, reducing the value of $t_{AC}$ can either reduce the overall delay in retrieving data or can permit other delays that contribute to the overall delay to be increased without exceeding the overall timing budget. Further, reducing the value of $t_{AC}$ may permit greater timing flexibility in latching retrieved data at the OCDs, thereby providing greater leeway in the timing of the clock signal used to supply the data to the OCDs.

SUMMARY OF THE INVENTION

In accordance with one aspect of the present invention, a memory device capable of performing a read operation includes: a memory array that stores data; and a plurality of off-chip drivers that supply as an output of the memory device, data retrieved from the memory array. At least one of the off-chip drivers includes: an enable circuit that generates an enable signal in response to a read enable signal received by the off-chip driver, wherein the enable circuit controls the timing of the enable signal in accordance with a timing signal supplied to the enable circuit; and a driver circuit that drives the data off the memory device in response to the enable signal.

The enable circuit can include a trigger circuit that latches an input signal upon receipt of the timing signal to produce the enable signal. The trigger circuit controls the timing of the enable signal such that an enabled state of the enable signal is triggered to be synchronous with the data being supplied to the off-chip driver. The enable circuit can further include enable logic that processes a static enable signal associated with the off-chip driver and an AND function that receives as inputs the read enable signal and the output of the enable logic, wherein the output of the AND function is supplied as the input to the trigger circuit.

A plurality of trigger circuits respectively corresponding to the plurality of off-chip drivers can supply the data to the off-chip drivers in accordance with the timing of the timing signal. The off-chip drivers can further include an AND function that receives as inputs the enable signal and the data, and supplies an output to the driver circuit. According to this arrangement, propagation delays $t_L$ in the enable logic that processes the static enable signal do not affect the timing of the data driven off the memory device and do not contribute to the overall delay $t_{AC}$ in the read operation.

In accordance with another aspect of the present invention, the off-chip drivers of a memory device include: an enable circuit that receives a static enable signal associated with an individual off-chip driver and a read enable signal, wherein the enable circuit generates an internal enable signal from the static enable signal and read enable signal, and wherein a timing of the internal enable signal is controlled in accordance with a timing signal supplied to the enable circuit; and a driver circuit that drives data off the memory device in response to the internal enable signal. The enable circuit can include: enable logic that processes the static enable signal; an AND function that receives as inputs the read enable signal and an output of the enable logic; and a trigger circuit that latches an output of the AND function upon receipt of the timing signal to produce the internal enable signal, such that propagation delays in the enable logic do not affect the timing of the internal enable signal.

In accordance with another aspect of the present invention, the off-chip drivers of a memory device include: an enable circuit that receives a static enable signal associated with an individual off-chip driver and a read enable signal, the enable circuit including a trigger circuit that generates an internal enable signal whose timing corresponds to a timing signal supplied to the trigger circuit, such that the internal enable signal transitions to an enabled state in response to the static enable signal and the read enable signal being in enabled states and the timing signal transitioning from a first state to a second state; and a driver circuit that drives data off the memory device in response to the internal enable signal. The trigger circuit can generate the internal enable signal by latching an input signal upon receipt of the timing signal, and controls the timing of the enable signal such that the enabled state of the enable signal is triggered to be synchronous with the data being supplied to the off-chip driver.

According to another aspect of the present invention, a memory device capable of performing a read operation includes: means for storing data; and means for reading the data from the memory device. The means for reading includes: means for generating an internal enable signal within the means for reading in response to a read enable signal, wherein the means for generating controls a timing of the enable signal in accordance with a timing signal; and means for driving the data off the memory device in response to the enable signal.

According to yet another aspect of the present invention, a method of manufacturing a memory device capable of performing a read operation includes: providing a memory array for storing data; providing a plurality of off-chip drivers for supplying as an output of the memory device, data retrieved from the memory array; and providing at least one of the off-chip drivers with at least: an enable circuit for generating an enable signal in response to a read enable signal received by the off-chip driver, the enable circuit controlling a timing of the enable signal in accordance with a timing signal supplied to the enable circuit; and a driver circuit for driving the data off the memory device in response to the enable signal. The enable circuit can be provided with a trigger circuit that latches an input signal upon receipt of the timing signal to produce the enable signal. The trigger circuit controls the timing of the enable signal such that an enabled state of the enable signal is triggered to be synchronous with the data being supplied to the off-chip driver.

According to still another aspect of the present invention, a method of performing a read operation in a memory device includes: supplying to an internal trigger circuit of an off-chip driver of the memory device, a signal derived from both a static enable signal individually associated with the off-chip driver and a read enable signal introduced downstream of logic that processes the static enable signal; triggering the internal trigger circuit of the off-chip driver with a timing signal to latch an internal enable signal; simultaneously triggering, with the timing signal, a data trigger circuit associated with the off-chip driver to latch data retrieved from a memory array of the memory device; and driving the data off the memory device in response to the internal enable signal being in an enabled state. The method can further include: supplying the internal enable signal and the latched data to an AND function within the off-chip driver to generate an enabled data signal; and supplying the enabled data signal to a driver circuit for driving the data off the memory device.

According to another aspect of the present invention, a method of performing a read operation in a memory device includes: respectively supplying a plurality of static enable signals to a plurality of off-chip drivers of the memory device; supplying a common read enable signal to the plurality of off-chip drivers, the read enable signal being introduced in the off-chip drivers downstream of logic for processing the static enable signals in the off-chip drivers; individually triggering generation of internal enable signals in respective ones of the off-chip drivers, wherein each internal enable signal is derived from both the read enable signal and the static enable signal supplied to the off-chip driver, the timing of the internal enable signal corresponding to a timing signal supplied to the off-chip drivers; respectively supplying a plurality of data bits to the respective ones of the off-chip drivers in synchronization with the internal enable signals; and driving the data bits off the memory device from the respective ones of the off-chip drivers in response to the internal enable signals being in an enabled state. The read operation can be a read burst operation.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DESCRIPTION OF THE PREFERRED EMBODIMENTS

Figure 1:
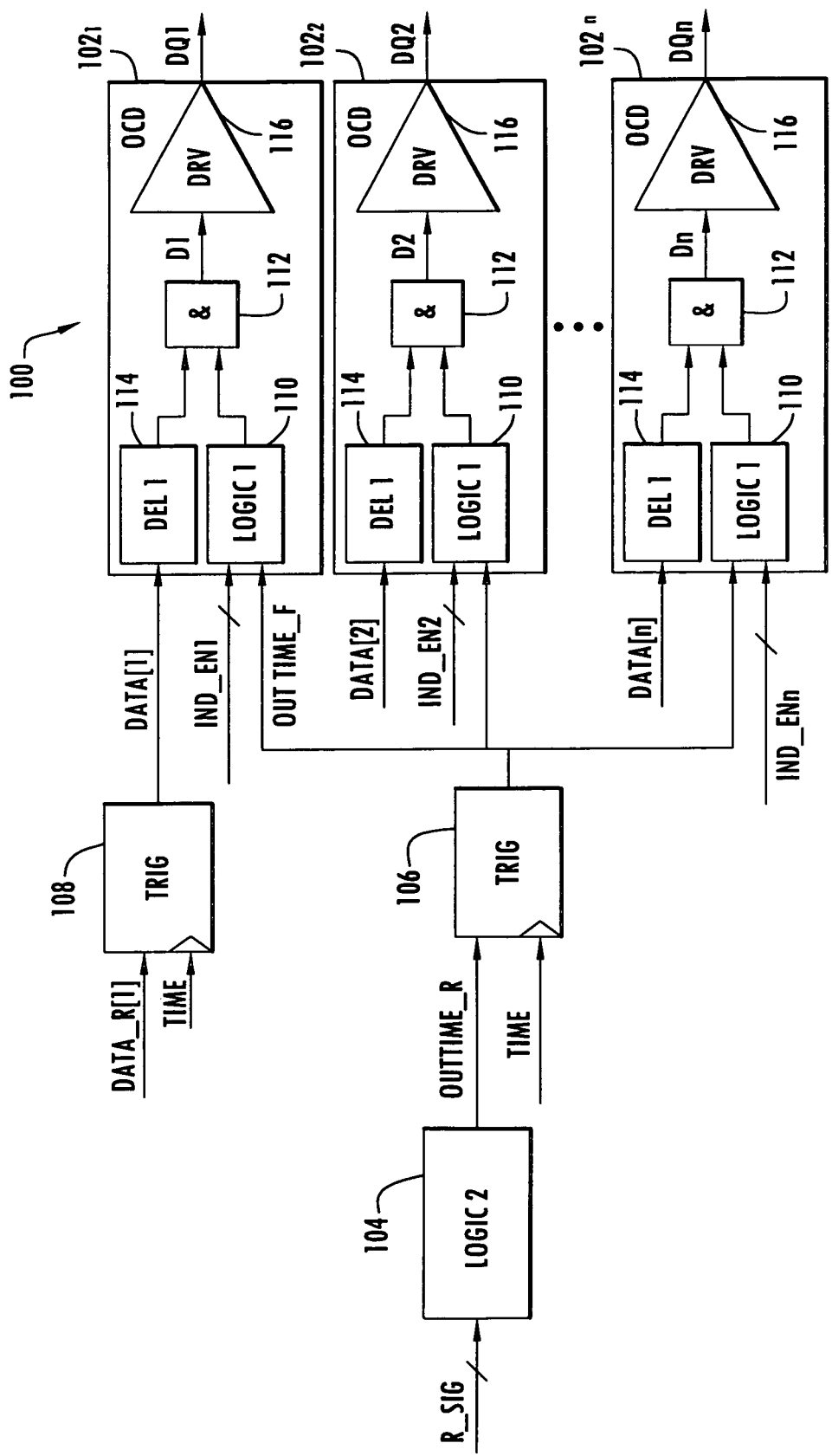
FIG. 1 is a block diagram of the read output portion of a typical memory device having no on-chip DLL, such as a DDR SDRAM.

To better illustrate the invention, operation of a typical memory device having no on-chip DLL will be described in connection with FIGS. 1 and 2 for contrast. More specifically, a block diagram of the read output portion of a memory device 100 capable of driving data to external signal lines of a data bus is shown in FIG. 1. Memory device 100 can be, for example, a DDR SDRAM chip capable of driving data off the chip at a double data rate (i.e., on both the rising and falling edges of a clock signal). Since a system that features DDR SDRAMs can connect multiple SDRAMs to the same data lines within a data bus, the output drivers (OCD) of a DDR SDRAM must be turned off (disabled) when not needed in order to avoid system contamination caused by two or more active OCDs driving against each other on the same lines.

Standard DDR SDRAMs have two kinds of OCD disabling/enabling functionalities. One enabling/disabling functionality addresses every OCD on a DDR SDRAM output driver individually ($Ind\_EN_1$–$Ind\_EN_n$, where n is the number of OCDs on the DDR SDRAM chip. These signals contain information about which OCDs are used in that system (e.g., DQ organization) and/or enable/disable individual OCDs for special functions (e.g., production test modes). More specifically, DQ organization dictates how a DDR SDRAM chip is configured for use in a particular system. For example, a DDR SDRAM chip may include sixteen OCDs for driving sixteen parallel bits off the chip (i.e., the chip has the capability to read out 16-bit words); however, the system in which the chip is used may require only eight of the OCDs to supply data. In this case, DQ organization could specify that $Ind\_EN_1$–$Ind\_EN_8$ are set to a logical value that enables eight of the OCDs and that $Ind\_EN_9$–$Ind\_EN_{16}$ are set to the opposite logical value to disable the remaining eight OCDs. Likewise, specific enable/disable signals $Ind\_EN_i$, where the index i can be any value from 1 to n, can be turned on and off as necessary during a test mode to test operation of specific OCDs. In any event, while these individual enable/disable signals $Ind\_EN_1$–$Ind\_EN_n$ must be received by the n individual OCDs of the DDR SDRAM, these signals do not typically change during read operations and are thus not timing critical. Accordingly, such individual enable/disable signals can be considered "static" during a read operation of the DDR SDRAM and hereinafter may be referred to as static enable signals or individual static enable signals.

The second type of enabling signal is a signal that is supplied to each data OCD and enables/disables all data OCDs that are enabled by static enable signals when a read operation is performed to drive read data off the DDR SDRAM chip. This read operation enabling signal (or simply "read enable" signal), also determines the timing of the first and the last data word that is driven off the DDR SDRAM during that read burst. Consequently, the read enable signal is triggered by an internal trigger signal that controls the timing of the read output operation.

FIG. 1 illustrates a typical implementation of a disable/enable scheme for an n data OCD on a DDR SDRAM that involves the aforementioned two types of enabling signals. Specifically, memory device 100 includes a plurality of off-chip drivers (OCDs) $102_1$–$102_n$, which respectively receive individual (static) enable signals $Ind\_EN_1$–$Ind\_EN_n$. Another enable signal (Outtime_F) is supplied to each of the OCDs $102_1$–$102_n$ at the time of a read burst operation. Outtime_F is generated as follows. A number of read data control signals R_Sig are processed via internal logic, represented by a LOGIC2 block 104 in FIG. 1, to produce a read OCD enable signal Outtime_R. The Outtime_R signal is then supplied to a trigger circuit 106 and latched with an internal timing generating signal (Time) to add the output timing information to Outtime_R and generate Outtime_F. In other words, trigger circuit 106 produces Outtime_F as a delayed version of Outtime_R, where the timing of Outtime_F is consistent with the timing of the Time signal. Outtime_F is then routed to the data OCDs $102_1$–$102_n$ on the DDR SDRAM chip.

Concurrently, data (Data_R[1:n]) is retrieved from the memory array (not shown) of the DDR SDRAM. The notation [1:n] indicates the Data_R is an n-bit word, with each of the n bits being supplied to a respective one of the n OCDs. As shown in FIG. 1, another trigger circuit 108 latches Data_R[1] with the internal timing generating signal Time to produce a signal (Data[1]) that is supplied to OCD $102_1$ in accordance with the timing of the signal Time. Data[2:n] are likewise latched and simultaneously supplied to OCDs $102_2$–$102_n$, respectively. For simplicity, depiction of data trigger circuits corresponding to each of the OCDs has been omitted from FIG. 1.

In each OCD $102_i$, the enable signal Outtime_F and the individual enable/disable information $Ind\_EN_i$ for that OCD are supplied to a logic circuit, represented by Logic1 block 110 in FIG. 1. This logic circuit may also receive and process other OCD control signals in combination with the two enable signals. If both the Outtime_F and $Ind\_EN1$ signals indicate an enable state, Logic1 block 110 supplies an enable signal to an AND function 112. Processing the Outtime_F and $Ind\_EN_i$ signals through Logic1 block 110 introduces a delay $t_L$ (i.e., a propagation delay from receipt of the rising edge of the Outtime_F signal to the rising edge of the corresponding signal at the output of Logic1 block 110). The data signal (Data[i]) is supplied to the other input of the AND function 112 after being delayed by a delay function represented by the DEL1 block 114, which intentionally introduces a delay $t_L$ to the data signal to mimic the delay introduced by Logic1 block 110 on the enable signal to assure the correct timing (synchronization) between the enable and data signals (a significant timing offset between the data and the enable signal could detrimentally affect the first or last data access in the read burst). The AND function 112 combines the enable signal with the read data (Data[i]) to produce the signal $D_i$. In other words, the signal $D_i$ follows the data signal Data[i] when both the Outtime_F signal and the $Ind\_En_i$ enable OCD $102_i$. The signal $D_i$ is, in turn, supplied to a driver circuit DRV 116, which produces a corresponding output signal $DQ_i$ that is driven off the chip and onto an external signal line of a data bus.

Figure 2:
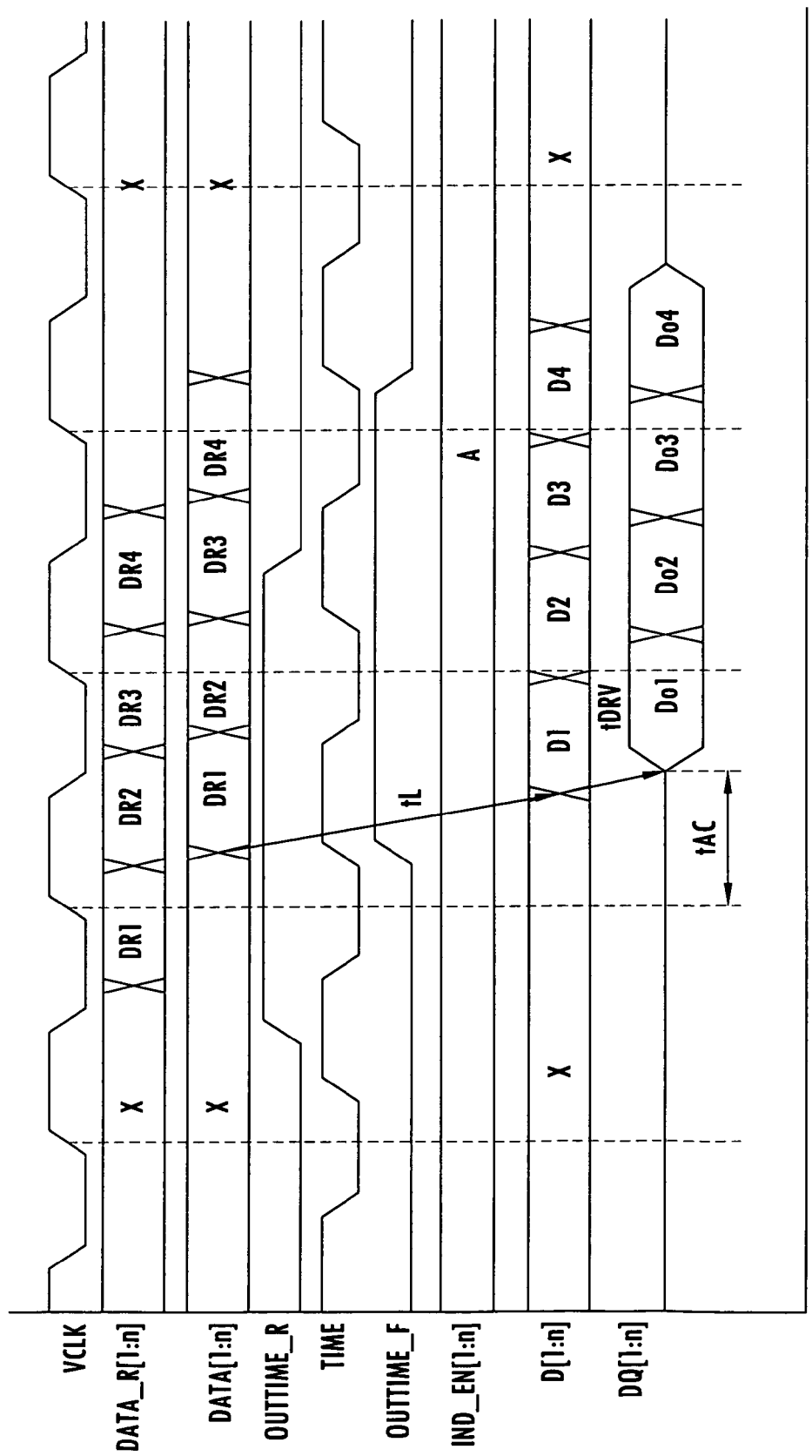
FIG. 2 is a timing diagram illustrating various signal values and delays during a read burst operation in the memory device FIG. 1.

FIG. 2 shows a timing diagram illustrating operation of the enable/disable scheme in the circuit arrangement of FIG. 1. The external clock signal VCLK is shown at the top of FIG. 2 with dashed lines extending vertically down the figure from the center of each rising edge of VCLK to provide a reference for illustrating timing delays. The following line in the timing diagram illustrates the presence of the retrieved data Data_R[1:n] at the inputs to the data trigger circuits 108. In this example, a read burst of four words DR1–DR4 is being performed.

The internal timing generating signal, Time, is an oscillating clock signal having the same period as VCLK. However, Time is offset from VCLK by a delay $t_{CLK}$ resulting from the CLK receiver and the internal clock tree via which Time is derived from VCLK ($t_{CLK}$ is not explicitly denoted in FIG. 2). For each OCD $102_i$, the internal clock signal Time is used by a corresponding trigger circuit 108 to latch Data_R[i] and produce an output signal Data[i] synchronized to the timing of the signal Time, which is then supplied to the OCD $102_i$. Specifically, as shown in FIG. 2 on the Data[1:n] line, a first data word DA1, corresponding to DR1, is supplied to the OCDs on the rising edge of Time. The next word DA2 is supplied on the next falling edge of Time, and the word DA3 is supplied on the following rising edge of Time. Finally, the fourth word DA4 is supplied on the next falling edge of Time. The delay $t_{DP}$ (not explicitly denoted in FIG. 2) is the delay from the trigger circuit 108 to the DEL1 block 114 in OCD $102_i$.

Similarly, after the signal Outtime_R has transitioned from a disabled state (logical low state in FIG. 2) to an enabled state (logical high state in FIG. 2) to perform a read burst operation, Outtime_F transitions from a disabled (low) state to an enabled (high) state at the next rising edge of the signal Time via operation of the trigger circuit 106. Outtime_F returns to the disabled (low) state on the next rising edge of the Time signal following the Outtime_R signal returning to the disabled (low) state to thereby terminate the read burst operation. In the example shown in FIG. 2, all of the individual static enable signals $Ind\_EN_1$–$Ind\_EN_n$ are assumed to be in an enabled state.

As previously mentioned, the delay $t_L$ is the propagation delay through the logic circuit indicating by Logic1 block 110, which is mimicked by the delay circuit DEL1 114.

This delay is shown in FIG. 2 as the timing offset (delay) between DATA[1:n] (which are the data words at the input to DEL1 114) and D[1:n] (which are the corresponding data words at the input to the AND function 112).

Another propagation delay $t_{DRV}$ results from the AND function 112 and the DRV block 116. As shown in FIG. 2, the propagation delay $t_{DRV}$ results in a timing delay between D[1:n] (i.e., the data words at the input to the AND function 112) and the output signal DQ[1:n] that is driven off the DDR SDRAM chip.

In a standard DDR SDRAM, the $t_L$ and $t_{DRV}$ propagation delays do not present a problem, because the signal Time, which triggers the timing of the OCDs, is generated from an on-chip DLL that can advance VCLK by any given time. Consequently, $t_{AC}$ is not a function of $t_L$ or $t_{DRV}$. However, in the newer generation of specialty DDR SDRAMs which lack an on-chip DLL, such as those used in mobile applications, the delay $t_{AC}$ is, in part, a function of $t_L$ and $t_{DRV}$. In particular, $t_{AC}=t_{CLK}+t_{DP}+t_L+t_{DRV}$ where, again, $t_{CLK}$ is the delay of the CLK receiver and tree (i.e., the timing offset between VCLK and Time), and $t_{DP}$ is the delay from the trigger circuit to the DEL1 block 114. Consequently, in DDR SDRAMs that lack on-chip DLLs, the propagation delay $t_L$ increases the overall delay $t_{AC}$ and potentially introduces greater variability in the value of $t_{AC}$ from OCD to OCD, from chip to chip, and in individual OCDs over a period of time.

Figure 3:
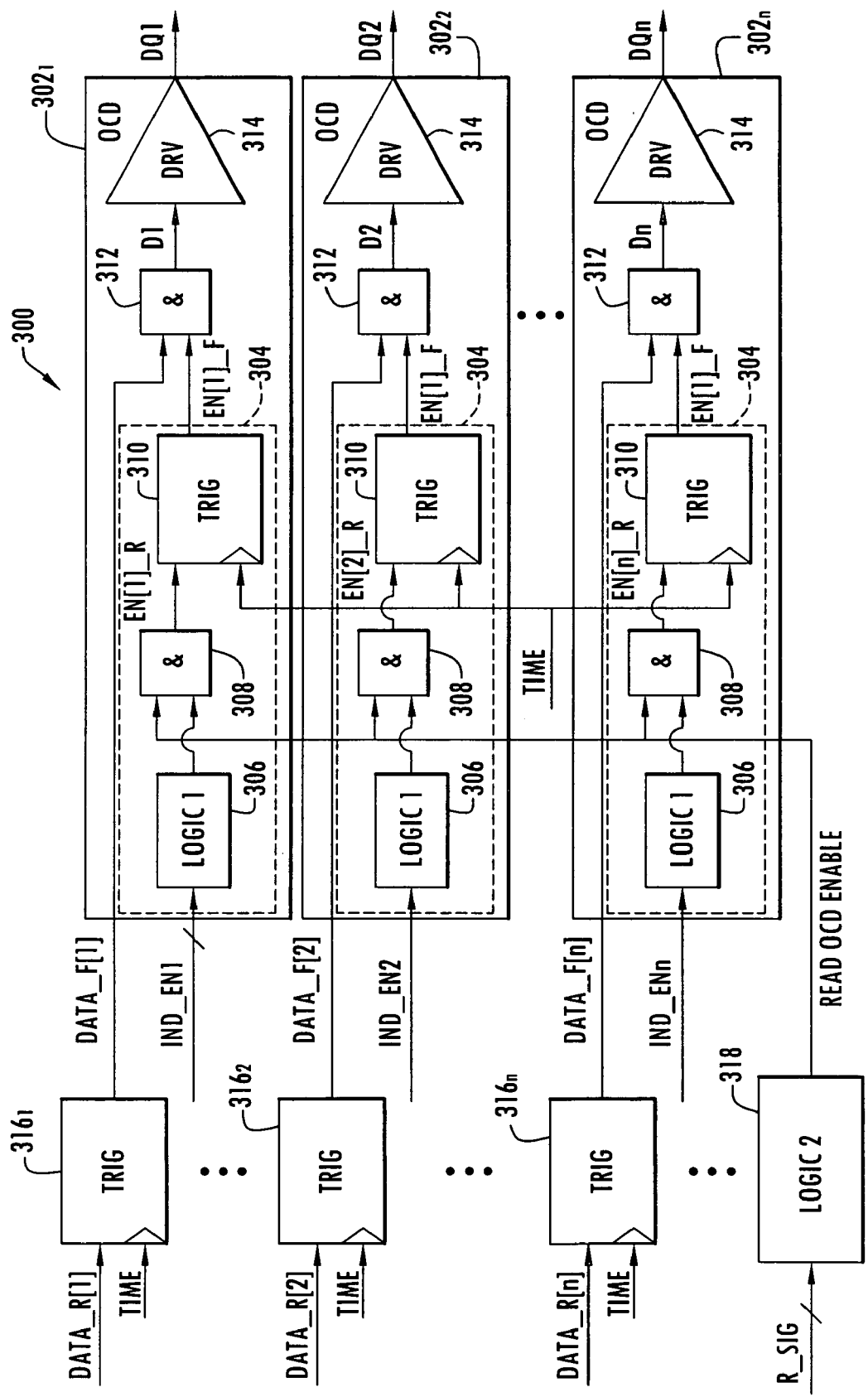
FIG. 3 is a block diagram of the read output portion of a memory device according to an exemplary embodiment of the present invention.

FIG. 3 is a block diagram of a read output section of a memory device 300 according to an exemplary embodiment of the present invention, in which the contribution of $t_L$ is eliminated from the overall output delay $t_{AC}$. The architecture depicted in FIG. 3 is a conceptual diagram illustrating major functional units, and does not necessarily illustrate physical relationships. Memory device 300 can be, for example, a dynamic random access memory (DRAM), such as a double data rate (DDR) synchronous DRAM (SDRAM), or a reduced latency DRAM (RLDRAM). However, it will be understood that the invention is not limited to a particular type of memory device or the specific architecture shown in FIG. 3, and the invention is applicable to virtually any type of memory device in which internal timing delays such as $t_{AC}$ exist.

Included in memory device 300 are a number of modules and signals whose functions are generally similar to comparable modules and signals in memory device 100 shown in FIG. 1, with a number of important differences. Essentially, the implementation shown in FIG. 3 removes from the output delay $t_{AC}$ the delay $t_L$ associated with the enable logic circuit (denoted as Logic1) within the OCDs, thereby reducing the value of $t_{AC}$. By moving into the OCDs the trigger circuit used to control the timing of the read operation enable signal, the timing generation for each OCD is customized, and the delay $t_L$ associated with processing the individual "static" OCD enable/disable signals can be shifted to occur before the internal trigger circuit, thereby removing the delay $t_L$ from the chain of delays that constitute $t_{AC}$.

More specifically, memory device 300 includes a plurality of off-chip drivers (OCDs) $302_1$–$302_n$. Each OCD $302_i$ includes an internal enable circuit 304 that includes a Logic1 block 306, an AND function 308, and a trigger circuit 310. The trigger circuit can be for example, a flip flop circuit or any circuit arrangement capable of latching an input signal in response to a signal, such as a clock signal or a trigger signal. The invention is not limited to memory devices having any particular number of OCDs or that generate data words having any particular number of bits. Like the OCDs shown in the memory device of FIG. 1, the OCDs receive both individual (static) enable signals Ind_EN$_1$–Ind_EN$_n$ and a read OCD enable signal; however, these two types of enable signals are processed differently by the OCDs $302_i$ of memory device 300. In particular, a number of read data control signals R_Sig are processed via logic represented by a LOGIC2 block 318 in FIG. 3, to produce a read OCD enable signal which is supplied to each of the OCDs $302_1$–$302_n$ at the time of a read burst operation. However, this read enable signal need not be latched with the timing signal Time prior to being supplied to the OCDs $302_i$.

The individual static enable signals Ind_EN$_1$–Ind_EN$_n$ are supplied to the Logic1 blocks 306 in much the same manner as in the circuit arrangement shown in FIG. 1; however, the read OCD enable signal is not supplied to the Logic1 block 306. This logic circuit may also receive and process other OCD control signals in combination with the individual static enable signal. If the Ind_EN$_i$ signal and other control signals processed in Logic1 block 306 indicate a static enable state, Logic1 block 306 supplies an enable signal to AND function 308. Note that processing the Ind_EN$_i$ signal through Logic1 block 308 still involves a delay $t_L$ between the time of arrival of input signals at the Logic1 block 308 and appearance of the corresponding signal at the output of Logic block 308. However, this delay no longer factors into overall read data delay $t_{AC}$, as will become more clear from the following description.

Rather than supplying the read OCD enable signal to Logic1 block 306, the read OCD enable signal is received as an input to AND function 308 along with the output of Logic1 block 306. AND function 308 and AND function 312 in the OCDs can be actual AND gates or any other circuit arrangement that produces a signal that is a logical AND of the two input signals (e.g., two input lines simply tied together into a single output line). The output of AND function 308 (EN[i]_R) transitions from a disabled state to an enabled state when both the read OCD enable signal and the output of Logic1 block 306 (derived from the individual static enable signal) are in an enabled state. Generally, this occurs when the read OCD enable signal transitions to an enabled state, since the individual static enable signal remains in a constant enabled state during operation for those OCDs that are driving read data.

The enable signal EN[i]_R generated at the output of AND function 308 is supplied to internal trigger circuit 310, which latches the EN[i]_R on the next rising edge of the internal timing generating signal Time to generate an enable signal EN[i]_F in accordance with the timing of the Time signal. In other words internal trigger circuit 310 produces EN[i]_F as a delayed version of EN[i]_R, where the timing of EN[i]_F is consistent with the timing of the Time signal. Unlike the circuit of FIG. 1, the latching of EN[i]_F (compared to Outtime_F) occurs within each OCD $302_i$ using a trigger circuit that is internal to the OCD, and the latching of the enable signal occurs downstream of any delays caused by the Logic1 block rather than upstream of the Logic1 block. Thus, by bypassing the Logic1 block 306, the read OCD enable signal becomes available to the OCD without introducing the delay $t_L$ into the critical timing path.

The bits of data words (Data_R[1:n]) retrieved from the memory array (not shown) of the DDR SDRAM are respectively supplied to data trigger circuits $316_i$, which latches Data_R[1] with the internal timing generating signal Time to produce a signal (Data_F[1:n]) that is supplied to OCDs $302_1$–$302_n$ in accordance with the timing of the signal Time.

Each OCD further includes an AND function 312 that receives the output of the internal enable circuit 304 (EN[i]_F) and the data signal (Data_F[i]). Unlike the circuit of FIG. 1, there is no delay $t_L$ present in the latched enable signal EN[1]_F, because the enable signal EN[1]_R is latched by the Time signal downstream of the Logic1 block 306. Consequently, it is unnecessary to introduce a delay $t_L$ in the data signal Data_F[i] arriving at OCD $302_i$ to match a delay in the enable signal (note the absence in FIG. 3 of a delay function corresponding to the DEL1 block in FIG. 1), and the data signal Data_F[i] can be supplied directly to AND function 312.

The AND function 312 combines the enable signal (EN[i]_F) with the read data (Data_F[i]) to produce the signal D[i]. In other words, the signal $D_i$ follows the data signal Data_F[i] when the enable signal EN[i]_F is in an enabled state, and no data signal is produced at the output of the AND function 312 when the enable signal EN[i]_F is in a disabled state. The signal $D_i$ is in turn supplied to a driver circuit DRV 314, which produces a corresponding output signal $DQ_i$ that is driven off the chip and onto an external signal line of a data bus.

Figure 4:
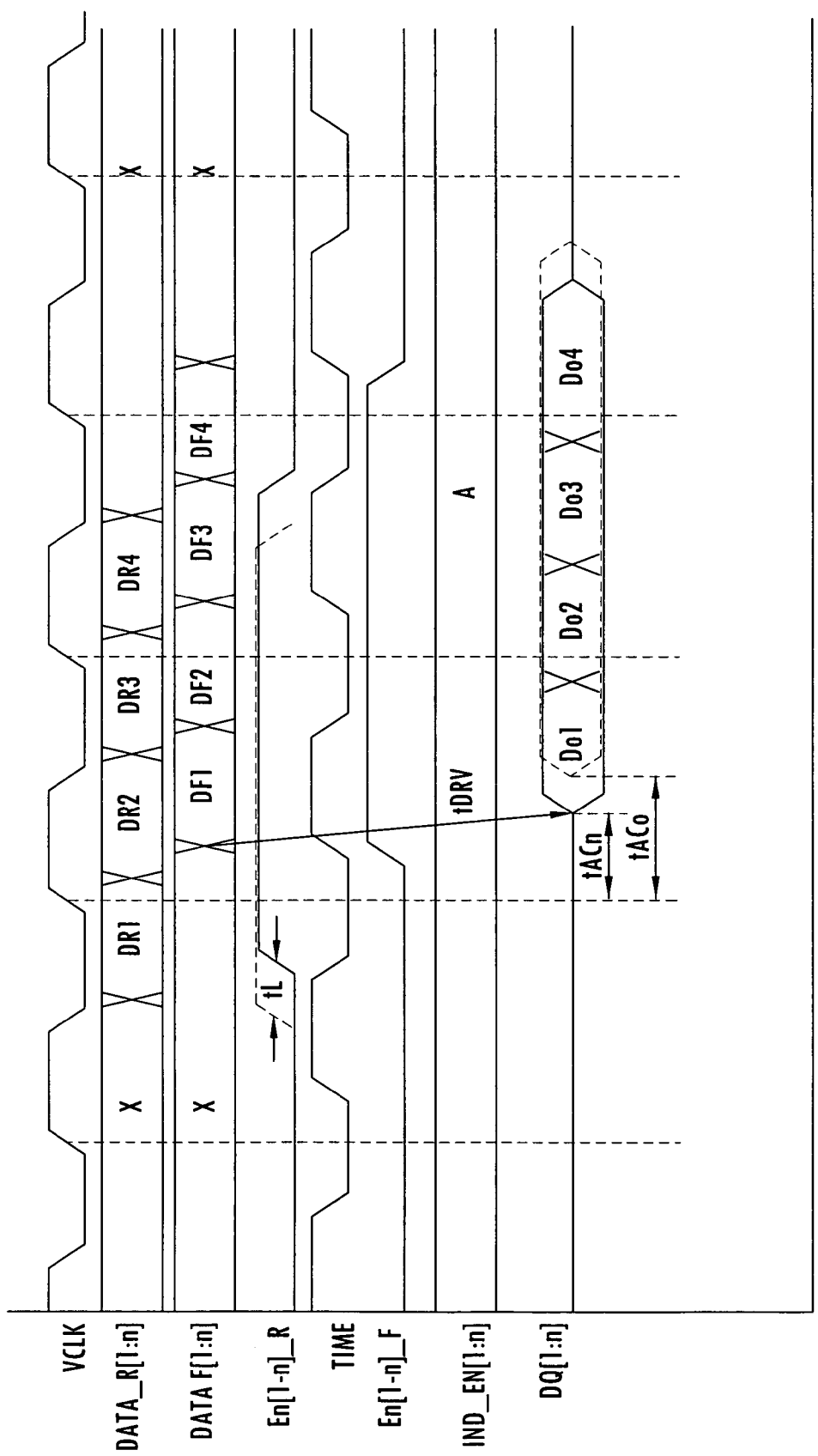
FIG. 4 is a timing diagram illustrating various signal values and delays during a read burst operation in the memory device of FIG. 3 in accordance with an exemplary embodiment of the present invention.

FIG. 4 shows a timing diagram illustrating operation of the enable/disable scheme in the circuit arrangement of FIG. 3 according to an exemplary embodiment of the present invention. The external clock signal VCLK is shown at the top of FIG. 4, with dashed lines extending vertically down the figure from the center of each rising edge of VCLK to provide a reference for illustrating timing delays. After VCLK, the next line in the timing diagram illustrates the presence of the retrieved data Data_R[1:n] at the inputs to the data trigger circuits $316_i$. In this example, a read burst of four words DR1–DR4 is being performed. However, it will be understood that the present invention is not limited to read bursts of any particular length.

As previously described, the internal timing generating signal Time is an oscillating clock signal that controls the timing of data being supplied to data OCDs $302_i$, and is essentially a delayed version of the external clock signal VCLK, having the same period as VCLK, but offset from VCLK by a delay $t_{CLK}$ resulting from the CLK receiver and the internal clock tree. For each OCD $302_i$, the internal clock signal Time is used by the corresponding data trigger circuit $316_i$ to latch Data_R[i] to produce an output signal Data_F[i] synchronized to the timing of the signal Time, which is then supplied to the OCD $302_i$. Specifically, as shown in FIG. 4 on the Data_F[1:n] line, a first data word DF1, corresponding to DR1, is supplied to the OCDs on the rising edge of Time. The next word DF2 is supplied on the next falling edge of Time, and the word DF3 is supplied on the following rising edge of Time. Finally, the fourth word DF4 is supplied on the next falling edge of Time. The delay $t_{DP}$ (not explicitly denoted in FIG. 2) is the delay from the trigger circuits $316_i$ to the AND function 312 in OCD $302_i$.

Similarly, after the enable signal EN[i]_R has transitioned from a disabled state (logical low state in FIG. 4) to an enabled state (logical high state in FIG. 4) to perform a read burst operation, the enable signal EN[i]_F transitions from a disabled (low) state to an enabled (high) state at the next rising edge of the signal Time via operation of the internal trigger circuit 310. The enable signal EN[i]_F returns to the disabled (low) state on the next rising edge of the Time signal following the EN[i]_R signal returning to the disabled (low) state to thereby terminate the read burst operation. In the example shown in FIG. 4, all of the individual static enable signals $Ind\_EN_1$–$Ind\_EN_n$ are assumed to be in an enabled state.

As suggested by the dashed line shown in FIG. 4, the propagation delay $t_L$ for Logic1 block 306 is, in effect, included in the timing of the signals En[i]_R, which is gated later by Time in trigger circuit 310 and is therefore not visible for $t_{AC}$. Likewise, because it is not necessary to intentionally delay the data signal by the delay $t_L$, the output data DQ[i] is delayed relative to the data signal Data_F[i] by only $t_{DRV}$, which is the propagation delay caused by AND function 312 and driver circuit 314 (see FIG. 4). Consequently, as depicted in the timing diagram of FIG. 4, the "new" $t_{ACn}$ achieved by the circuit of FIG. 3 is shorter than the $t_{AC}$ occurring in the circuit of FIG. 1 ($t_{ACo}$) by the duration of the delay $t_L$. Specifically, $t_{ACn} = t_{CLK} + t_{DP} + t_{DRV}$, and does not include any contribution from $t_L$. Consequently, the variability and the duration of the overall output delay $t_{AC}$ is reduced by the circuit arrangement and read operation scheme shown in FIGS. 3 and 4.

Further, it may be possible to process some controls signal conventionally processed in the output driver circuit in the Logic1 block. For example, a control signal that indicates an output current level based on how much drive current is required could be processed in the Logic1 block instead of the driver circuit DRV. This modification would have the effect of reducing $t_{DRV}$ and increasing $t_L$; however, this would still result in a reduction of $t_{AC}$, since $t_{AC}$ is not dependent on $t_L$.

While particular signal polarities are used in FIG. 4 to describe the invention (e.g., "high" and "low" states), it will be appreciated that the invention is not limited to the use of signals of any particular polarity or any particular correspondence between states of certain signal and certain functions. For example, while the enable signals being in a "high" state are associated with an enabled state and enable signals being in a "low" state are associated with a disabled state, the invention would operate equally well with an opposite polarity convention. Likewise, certain signals described as being triggered on rising edges of clock signals could be triggered on falling edges and vice versa.

Figure 5:
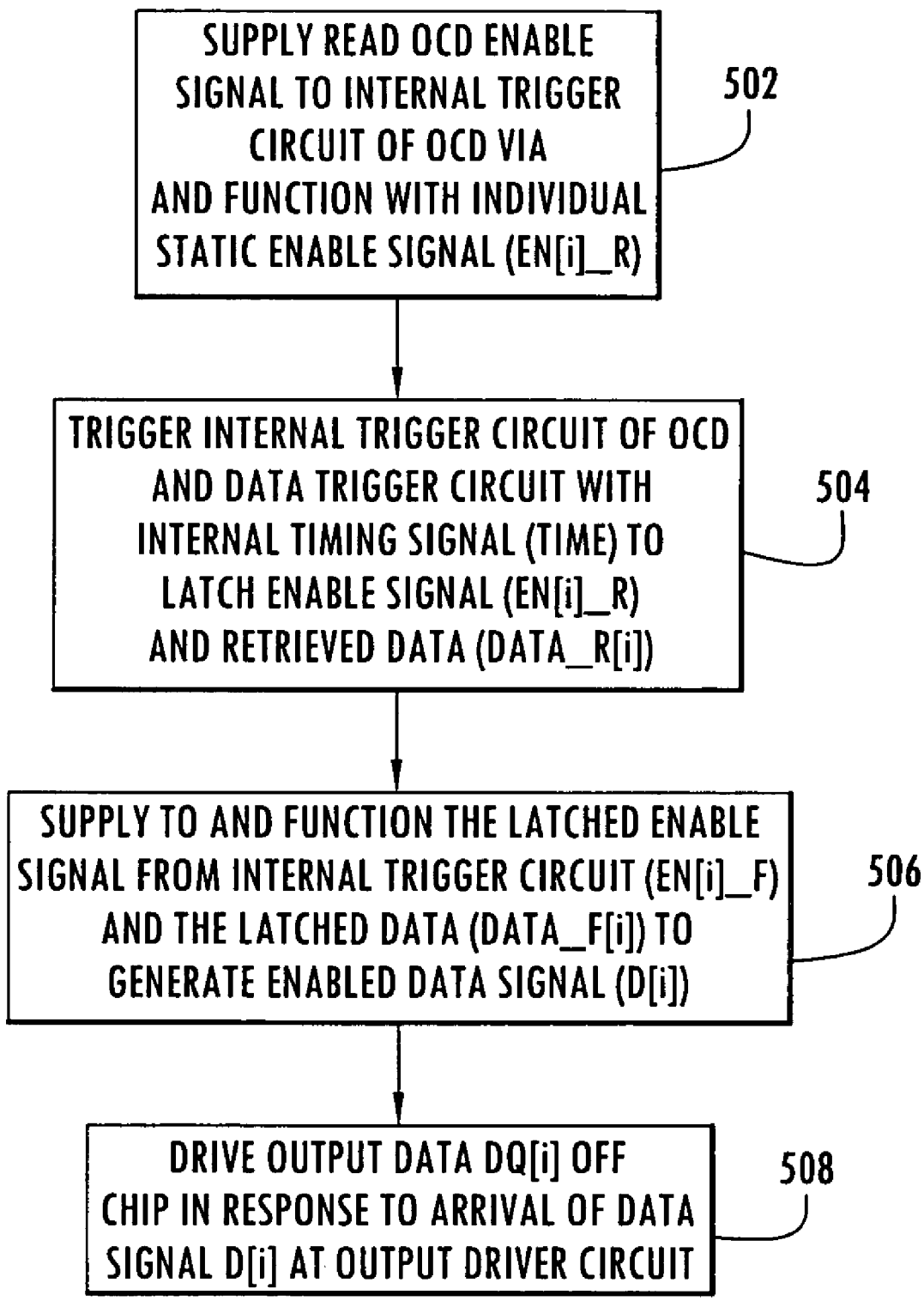
FIG. 5 is a functional flow diagram illustrating the operations performed to implement a read burst operation in accordance with an exemplary embodiment of the present invention.

Significant operations performed in accordance with the described embodiment of the present invention are summarized in the flow diagram shown in FIG. 5. In operation 502, the read OCD enable signal is supplied to the internal trigger circuit of each data OCD via an AND function with the individual static enable signal (EN[i]_R). In operation 504, the internal enable trigger circuit and the data trigger circuit are simultaneously triggered by the Time signal to latch the enable signal EN[i]_R and the retrieved data Data_R[i], respectively. Next, in operation 506, the latched enable signal EN[i]_F and the latched data Data_F[i] are supplied to the AND function to generate the enabled data signal D[i]. Finally, in operation 508, the output data DQ[i] is driven off the chip in response to arrival of the data signal D[i] at the output driver circuit.

Having described preferred embodiments of a new and improved memory device having off-chip drivers that include an enable circuit and related methods for reducing delays during read operations of the memory device, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A memory device capable of performing a read operation, comprising:
   a memory array configured to store data; and
   a plurality of off-chip drivers configured to supply as an output of the memory device data retrieved from the memory array, at least one of the off-chip drivers comprising:
   an enable circuit configured to generate an enable signal in response to a read enable signal received by the off-chip driver, the enable circuit generating the enable signal in response to a timing signal received by the off-chip driver such that a timing of the enable signal is not affected by upstream propagation delays caused by processing of the read enable signal within the enable circuit; and
   a driver circuit configured to drive the data off the memory device in response to the enable signal.

2. The memory device of claim 1, wherein the enable circuit comprises a trigger circuit that latches a signal derived from the read enable signal upon receipt of the timing signal to produce the enable signal.

3. The memory device of claim 2, wherein the trigger circuit controls the timing of the enable signal such that an enabled state of the enable signal is triggered to be synchronous with the data being supplied to the off-chip driver.

4. The memory device of claim 2, wherein the enable circuit further comprises:
   enable logic configured to process a static enable signal individually associated with the off-chip driver; and
   an AND function configured to receive as inputs the read enable signal and an output of the enable logic, the output of the AND function being supplied to the trigger circuit.

5. The memory device of claim 1, wherein the at least one of the off-chip drivers further comprises an AND function configured to receive as inputs the enable signal and the data, wherein the output of the AND function is supplied to the driver circuit.

6. The memory device of claim 1, further comprising:
   a plurality of trigger circuits respectively corresponding to the plurality of off-chip drivers, wherein the trigger circuits control the timing of the data being supplied to the off-chip drivers in accordance with a timing of said timing signal.

7. A memory device capable of performing a read operation, comprising:
   a memory array configured to store data; and
   a plurality of off-chip drivers configured to supply as an output of the memory device data retrieved from the memory array, at least one of the off-chip drivers comprising:
   an enable circuit configured to receive a static enable signal associated with an individual off-chip driver and a read enable signal, the enable circuit generating an internal enable signal from the static enable signal and read enable signal in accordance with a timing of a timing signal received by the off-chip driver such that a timing of the internal enable signal is not affected by upstream propagation delays caused by processing of the read enable signal within the enable circuit; and
   a driver circuit configured to drive the data off the memory device in response to the internal enable signal.

8. The memory device of claim 7, wherein the enable circuit comprises:
   enable logic configured to process the static enable signal;
   an AND function configured to receive as inputs the read enable signal and an output of the enable logic; and
   a trigger circuit configured to latch an output of the AND function upon receipt of the timing signal to produce the internal enable signal.

9. The memory device of claim 8, wherein the trigger circuit controls the timing of the enable signal such that an enabled state of the enable signal is triggered to be synchronous with the data being supplied to the off-chip driver.

10. The memory device of claim 7, wherein the at least one of the off-chip drivers further comprises an AND function configured to receive as inputs the internal enable signal and the data, wherein the output of the AND function is supplied to the driver circuit.

11. The memory device of claim 7, further comprising:
    a plurality of trigger circuits respectively corresponding to the plurality of off-chip drivers, wherein the trigger circuits control the timing of the data being supplied to the off-chip drivers in accordance with a timing of said timing signal.

12. A memory device capable of performing a read operation, comprising:
    a memory array configured to store data; and
    a plurality of off-chip drivers configured to supply as an output of the memory device data retrieved from the memory array, wherein each of the off-chip drivers comprises:
    an enable circuit configured to receive a static enable signal associated with an individual off-chip driver and a read enable signal, the enable circuit including a trigger circuit that generates an internal enable signal whose timing corresponds to a timing signal supplied to the trigger circuit, such that a timing of the internal enable signal is not affected by upstream propagation delays caused by processing of the read enable signal within the enable circuit and such that the internal enable signal transitions to an enabled state in response to the static enable signal and the read enable signal being in enabled states and the timing signal transitioning from a first state to a second state; and
    a driver circuit configured to drive the data off the memory device in response to the internal enable signal.

13. The memory device of claim 12, wherein the trigger circuit generates the internal enable signal by latching an input signal upon receipt of the timing signal.

14. The memory device of claim 13, wherein the trigger circuit controls the timing of the enable signal such that the enabled state of the enable signal is triggered to be synchronous with the data being supplied to the off-chip driver.

15. The memory device of claim 13, wherein the enable circuit further comprises:
    enable logic configured to process the static enable signal; and
    an AND function configured to receive as inputs the read enable signal and an output of the enable logic, wherein an output of the AND function is supplied as the input to the trigger circuit.

16. The memory device of claim 12, further comprising:
    an AND function configured to receive as inputs the internal enable signal and the data, wherein the output of the AND function is supplied to the driver circuit.

17. The memory device of claim 12, further comprising:
    a plurality of trigger circuits respectively corresponding to the plurality of off-chip drivers, wherein the trigger circuits control the timing of the data being supplied to the off-chip drivers in accordance with a timing of said timing signal.

18. A memory device capable of performing a read operation, comprising:
means for storing data; and
means for reading the data from the memory device, wherein the means for reading comprises:
means for generating an internal enable signal within the means for reading in response to a read enable signal, wherein the means for generating controls a timing of the internal enable signal in accordance with a timing of a timing signal such that the timing of the internal enable signal is not affected by upstream propagation delays caused by processing of the read enable signal by the means for generating; and
means for driving the data off the memory device in response to the enable signal.

19. The memory device of claim 18, wherein the means for generating comprises means for latching an input signal upon receipt of the timing signal to produce the enable signal.

20. The memory device of claim 19, wherein the means for latching controls the timing of the enable signal such that an enabled state of the enable signal is triggered to be synchronous with the data being supplied to the means for reading.

21. The memory device of claim 19, wherein the means for generating further comprises:
means for processing a static enable signal associated with the means for reading; and
means for generating a logical AND of the read enable signal and an output of the means for processing and for supplying the logical AND to the means for latching, wherein propagation delays in the means for processing do not affect the timing of the data driven off the memory device.

22. The memory device of claim 18, wherein the means for reading further comprises means for generating a logical AND of the enable signal and the data and for supplying the logical AND of the enable signal and the data to the means for driving.

23. The memory device of claim 18, further comprising:
means for controlling the timing of data being supplied to the means for reading in accordance with a timing of said timing signal.

24. A method of manufacturing a memory device capable of performing a read operation, comprising:
(a) providing a memory array for storing data;
(b) providing a plurality of off-chip drivers for supplying as an output of the memory device data retrieved from the memory array; and
(c) providing at least one of the off-chip drivers with at least: an enable circuit for generating an enable signal in response to a read enable signal received by the off-chip driver, the enable circuit controlling a timing of the enable signal in accordance with a timing signal supplied to the enable circuit such that a timing of the enable signal is not affected by upstream propagation delays caused by processing of the read enable signal within the enable circuit; and a driver circuit for driving the data off the memory device in response to the enable signal.

25. The method of claim 24, wherein (c) further comprises providing the enable circuit with a trigger circuit that latches an input signal upon receipt of the timing signal to produce the enable signal.

26. The method of claim 25, wherein the trigger circuit controls the timing of the enable signal such that an enabled state of the enable signal is triggered to be synchronous with the data being supplied to the off-chip driver.

27. The method of claim 25, wherein (c) further comprises providing the enable circuit with:
enable logic for processing a static enable signal associated with the off-chip driver; and
an AND function for generating the input to the trigger circuit from the read enable signal and the output of the enable logic.

28. A method of performing a read operation in a memory device, comprising:
(a) supplying to an internal trigger circuit of an off-chip driver of the memory device, a signal derived from both a static enable signal individually associated with the off-chip driver and a read enable signal introduced downstream of logic that processes the static enable signal;
(b) triggering the internal trigger circuit of the off-chip driver with a timing signal to latch an internal enable signal such that a timing of the internal enable signal is not affected by upstream propagation delays caused by processing of the read enable signal;
(c) simultaneously triggering, with the timing signal, a data trigger circuit associated with the off-chip driver to latch data retrieved from a memory array of the memory device; and
(d) driving the data off the memory device in response to the internal enable signal being in an enabled state.

29. The method of claim 28, wherein (d) includes:
supplying the internal enable signal and the data to an AND function within the off-chip driver to generate an enabled data signal; and
supplying the enabled data signal to a driver circuit for driving the data off the memory device.

30. The method of claim 28, wherein (a) includes:
supplying the read enable signal and an output of the logic to an AND function whose output is supplied to the trigger circuit.

31. A method of performing a read operation in a memory device, comprising:
(a) respectively supplying a plurality of static enable signals to a plurality of off-chip drivers of the memory device;
(b) supplying a common read enable signal to the plurality of off-chip drivers, the read enable signal being introduced in the off-chip drivers downstream of logic for processing the static enable signals in the off-chip drivers;
(c) individually triggering generation of internal enable signals in respective ones of the off-chip drivers, wherein each internal enable signal is derived from both the read enable signal and the static enable signal supplied to the off-chip driver such that a timing of the internal enable signal is not affected by upstream propagation delays caused by processing within said logic, the timing of the internal enable signal corresponding to a timing signal supplied to the off-chip drivers;
(d) respectively supplying a plurality of data bits to the respective ones of the off-chip drivers in synchronization with the internal enable signals; and
(e) driving the data bits off the memory device from the respective ones of the off-chip drivers in response to the internal enable signals being in an enabled state.

32. The method of claim 31, wherein the read operation is a read burst operation.

* * * * *